United States Patent
Srinivasan et al.

(10) Patent No.: US 9,595,343 B1
(45) Date of Patent: Mar. 14, 2017

(54) EARLY PREDICTION OF FAILURE IN PROGRAMMING A NONVOLATILE MEMORY

(71) Applicant: Apple Inc., Cupertino, CA (US)

(72) Inventors: Charan Srinivasan, Cupertino, CA (US); Eyal Gurgi, Herzliya Pituah (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/173,655

(22) Filed: Jun. 5, 2016

(51) Int. Cl.
  *G11C 16/04* (2006.01)
  *G11C 16/34* (2006.01)
  *G11C 16/10* (2006.01)
  *G11C 16/26* (2006.01)

(52) U.S. Cl.
  CPC .......... *G11C 16/3431* (2013.01); *G11C 16/10* (2013.01); *G11C 16/26* (2013.01); *G11C 16/3459* (2013.01)

(58) Field of Classification Search
  USPC .......................... 365/185.18, 185.28, 185.22
  See application file for complete search history.

(56) References Cited

U.S. PATENT DOCUMENTS

| | | | |
|---|---|---|---|
| 5,803,932 A | 9/1998 | Akimoto et al. | |
| 6,282,121 B1 | 8/2001 | Cho et al. | |
| 6,347,378 B1 | 2/2002 | MacArthur et al. | |
| 7,035,151 B2 | 4/2006 | Tran et al. | |
| 8,031,525 B2 | 10/2011 | Park | |
| 8,305,807 B2 | 11/2012 | Shah et al. | |
| 8,416,626 B2 | 4/2013 | Hemink | |
| 8,432,732 B2 | 4/2013 | Li et al. | |
| 8,456,905 B2 | 6/2013 | Kasorla et al. | |
| 8,730,722 B2 | 5/2014 | Koh et al. | |
| 8,897,085 B2 | 11/2014 | Li | |
| 2013/0159610 A1 | 6/2013 | Kawamura | |
| 2014/0075133 A1 | 3/2014 | Li et al. | |
| 2014/0136883 A1* | 5/2014 | Cohen ................. G06F 11/2094 714/6.11 |
| 2014/0237298 A1 | 8/2014 | Pe'Er | |

FOREIGN PATENT DOCUMENTS

CA 2019581 A1 1/1991

* cited by examiner

*Primary Examiner* — Vu Le
(74) *Attorney, Agent, or Firm* — D. Kligler IP Services Ltd.

(57) ABSTRACT

A storage device includes multiple memory cells and storage circuitry. The storage circuitry is configured to write data to a group of the memory cells by applying to the group of the memory cells up to a maximal number of programming pulses. The storage circuitry is further configured to evaluate, after applying less than the maximal number of programming pulses, a criterion that predicts whether or not the data will be written successfully within the maximal number of programming pulses, and when the criterion predicts that writing the data will fail, to perform a corrective operation.

20 Claims, 5 Drawing Sheets

EARLY PREDICTION OF FAILURE IN PROGRAMMING A NONVOLATILE MEMORY

TECHNICAL FIELD

Embodiments described herein relate generally to storage devices, and particularly to methods and systems for early prediction of failure in programming a nonvolatile memory.

BACKGROUND

In various nonvolatile storage systems, data is stored in memory cells that can be programmed to multiple predefined programming levels. Typically, writing data to the memory is carried out by applying multiple programming pulses to the memory cells, in an attempt to charge the memory cells to the appropriate programming levels. Methods for programming nonvolatile memories are known in the art. For example, U.S. Pat. No. 8,427,871, whose disclosure is incorporated herein by reference, describes a nonvolatile memory device that performs a program operation comprising applying a program pulse to selected memory cells, detecting a number of fail bits among the selected memory cells, the fail bits comprising failed program bits and disturbed inhibit bits, and determining a program completion status of the program operation based on the number of detected fail bits.

Some types of memory devices support parallel programming of memory cells in multiple planes. For example, U.S. Pat. No. 8,031,525, whose disclosure is incorporated herein by reference, describes a flash memory device that includes a voltage generator circuit configured to generate a program voltage, a pass voltage, and a high voltage. The memory device includes a plurality of planes configured to perform a program operation in response to the program, pass, and high voltages and to verify the program operation, respectively, and control logic configured to control the planes in response to verification results from the planes, wherein the control logic controls the planes so as to interrupt the program and pass voltages or the high voltage from being applied to program-passed planes.

SUMMARY

An embodiment that is described herein provides a storage device including multiple memory cells and storage circuitry. The storage circuitry is configured to write data to a group of the memory cells by applying to the group of the memory cells up to a maximal number of programming pulses. The storage circuitry is further configured to evaluate, after applying less than the maximal number of programming pulses, a criterion that predicts whether or not the data will be written successfully within the maximal number of programming pulses, and when the criterion predicts that writing the data will fail, to perform a corrective operation.

In some embodiments, the storage circuitry is configured to evaluate the criterion by estimating a trend of a parameter measured over multiple programming pulses, the parameter being indicative of a number of the memory cells in the group that have not yet reached their target levels. In other embodiments, the parameter includes measurements of an electrical current consumed during respective programming pulses. In yet other embodiments, the parameter includes numbers of memory cells that are inhibited from further programming after applying respective programming pulses.

In an embodiment, the storage circuitry is configured to estimate the trend by calculating differences between values of the parameter corresponding to different respective programming pulses, and to predict that writing the data will fail based on the differences. In another embodiment, the storage circuitry is configured to hold a reference parameter, to calculate a distance metric between the parameter and the reference parameter, and to predict that writing the data will fail when the distance metric exceeds a given distance threshold. In yet another embodiment, the storage circuitry is configured to evaluate the criterion by measuring an elapsed programming time since a starting time of writing the data, and to predict that writing the data will fail when the elapsed programming time exceeds a given timeout limit.

In some embodiments, the storage circuitry is configured to determine the given timeout limit based on statistical properties of programming execution times. In other embodiments, the group of the memory cells includes multiple subgroups that belong to different respective planes of the storage device, and the storage circuitry is configured to write the data using a multi-plane programming operation that applies the programming pulses to the memory cells in the multiple subgroups in parallel, and to perform the corrective operation by applying a single-plane programming to at least one of the planes. In yet other embodiments, the storage circuitry is configured to measure first and second parameters for respective first and second planes, and to predict that writing the data will fail in at least one of the first and second planes by evaluating the criterion based on both the first and second parameters.

There is additionally provided, in accordance with an embodiment that is described herein, a method including, in a storage device that includes multiple memory cells, writing data to a group of the memory cells by applying to the group of the memory cells up to a maximal number of programming pulses. After applying less than the maximal number of programming pulses, a criterion that predicts whether or not the data will be written successfully within the maximal number of programming pulses is evaluated, and when the criterion predicts that writing the data will fail, a corrective operation is performed.

These and other embodiments will be more fully understood from the following detailed description of the embodiments thereof, taken together with the drawings in which:

DETAILED DESCRIPTION OF EMBODIMENTS

Overview

Figure 1:
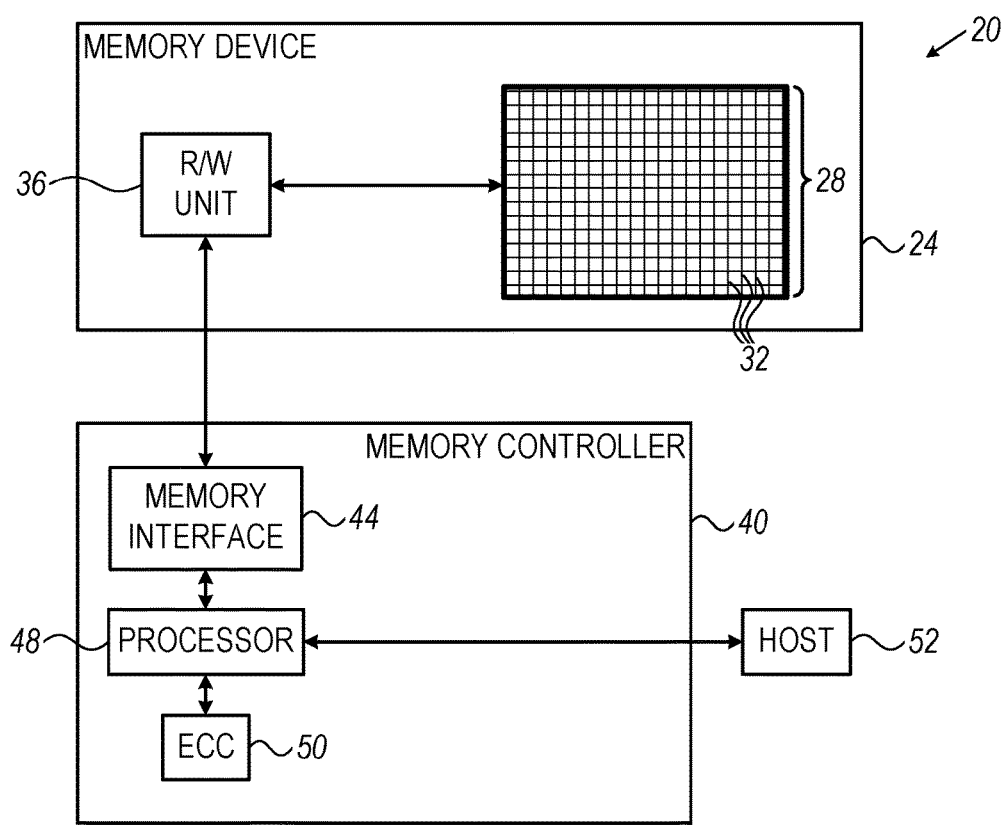
FIG. 1 is a block diagram that schematically illustrates a memory system, in accordance with an embodiment that is described herein.

In various storage systems, a memory device that comprises multiple memory cells stores data in a group of the memory cells by charging the memory cells to assume respective programming levels. When using iterative programming, the memory device programs the data by applying to the memory cells multiple program-and-verify (P&V) iterations.

In principle, after applying a programming pulse, the memory device can verify whether the memory cells being programmed have reached their target levels, and if not, continue the programming up to a maximal number of iterations. In such a programming scheme, however, the memory device detects a programming failure only after applying the maximal number of iterations, which consumes considerable power and limits the programming throughput. In addition, such a solution may cause programming disturb in memory cells that are faster to program, and cross-program disturb in multi-plane devices.

Embodiments that are disclosed herein provide methods and systems for predicting a programming failure before applying the maximal number of iterations. The disclosed techniques therefore result in increased programming throughput, reduced power consumption and improved reliability due to reduced disturb effects.

Consider an example memory device, in which data is written to a group of memory cells by applying to the memory cells in the group up to a maximal number of programming pulses. In some embodiments, after applying less than the maximal number of programming pulses, the memory device evaluates a criterion that predicts whether or not the data will be written successfully within the maximal number of programming pulses. If the criterion predicts that writing the data will fail, the memory device performs a corrective operation, e.g., recovers the data that failed to be programmed and writes the recovered data to a different location in memory.

The memory device may evaluate various types of criteria that predict programming failures. For example, in some embodiments the memory device measures a parameter that is indicative of the number of memory cells in the group that have not yet reached their target levels. Such a parameter is typically expected to decrease rapidly between successive programming pulses. The memory device estimates the behavior or trend of the parameter over multiple programming pulses and predicts a failure if the parameter behaves differently from some nominal expected behavior.

For example, in an embodiment, the memory device checks the decrease-rate of the parameter by calculating differences among the parameter measurements, or by calculating some distance metric between the measured parameter and a reference parameter that is provided by the manufacturer or learned during operation. If the parameter does not decrease as rapidly as expected, the memory device may conclude that programming failure is likely to occur. Note that this prediction and conclusion are performed very early in the programming process, possibly after 2-3 pulses.

In some embodiments, the memory device evaluates the criterion by measuring the elapsed programming time since the starting time of the write operation, and predicts a programming failure when the elapsed programming time exceeds a given timeout limit. The timeout limit can be determined, for example, based on statistical properties of the programming execution time, learned over multiple write operations.

In some embodiments, the memory cells are arranged in multiple planes than can be programmed in parallel using a multi-plane write operation, which applies the programming pulses to all the planes simultaneously. In such embodiments, when the memory device predicts a programming failure, the memory device stops the multi-plane operation and switches to single-plane programming. For example, upon predicting a programming failure, the memory device identifies in which of planes the programming has concluded, and applies a single-plane write operation only to the remaining planes.

In some embodiments, the evaluating the criterion is based on multiple parameters corresponding to multiple respective planes. For example, consider a memory device having first and second planes, and assume that the programming time in a second plane is expected to be longer, e.g., by 20% than in a first plane. The memory device monitors the programming progression in both planes, and if, for example, the programming in the second plane concludes before the programming in the first plane, the criterion predicts a programming failure in the first plane.

System Description

FIG. 1 is a block diagram that schematically illustrates a memory system 20, in accordance with an embodiment that is described herein. System 20 can be used in various host systems and devices, such as in computing devices, cellular phones or other communication terminals, removable memory modules, Solid State Disks (SSD), digital cameras, music and other media players and/or any other system or device in which data is stored and retrieved.

System 20 comprises a memory device 24, which stores data in a memory cell array 28. The memory array comprises multiple memory cells 32, such as analog memory cells. In the context of the present patent application, the term "analog memory cell" is used to describe any memory cell that holds a continuous, analog value of a physical parameter, such as an electrical voltage or charge. Array 28 may comprise solid-state analog memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having an integer resolution of one or more bits. Data is typically written to groups of memory cells and read from the groups of the memory cells in data units that are referred to as data pages, or simply pages, for brevity.

In some embodiments, a page is programmed to an entire row (word line) of the array. In alternative embodiments, each row can be divided to store two or more pages. For example, in some devices each row is divided into two pages, one comprising the odd-order cells and the other comprising the even-order cells. In some embodiments, memory pages are sub-divided into sectors.

In some embodiments, the memory cells are arranged in multiple memory arrays, also referred to as planes, and it is possible to program data into multiple respective planes in parallel. In the context of the present disclosure, a write operation in which data is programmed to multiple planes in parallel is referred to herein as a multi-plane programming operation, whereas a write operation that programs each plane separately is referred to as a single-plane programming operation.

In some embodiments, the R/W unit can erase a group of cells 32 by applying one or more negative erasure pulses to the cells.

In some embodiments, when programming or erasing a plurality of memory cells, the R/W unit sets the memory cells to respective target analog values, by applying to the memory cells a sequence of program-and-verify (P&V) or erase-and-verify (E&V) iterations. In each such iteration the R/W unit attempts to set the memory cells to assume the target analog values, by applying to the memory cells a programming (or erasure) pulse, and then verifies whether the target analog values have been reached in accordance with a verification condition.

For example, in some embodiments, the R/W unit may count the number of memory cells that have not reached a predefined verification threshold, and require that the counted number is smaller than a predefined permitted count for the operation to be considered successful. After applying a predefined number of iterations without meeting the verification condition, the R/W unit may recognize a programming (or erasure) failure.

In multi-plane programming, a programming pulse is applied to the memory cells being programmed in multiple respective planes simultaneously.

In some embodiments, a memory die is powered using some suitable power source. During the application of a programming pulse, the bit lines corresponding to the memory cells being programmed consume considerable amount of electrical current (also referred to as Icc) from the power source. In some embodiments, the R/W unit inhibits further programming to memory cells that already reached their target levels, and therefore the electrical current consumed is typically expected to decrease as the sequence of programming pulses progresses.

The storage and retrieval of data in and out of memory device 24 is performed by a memory controller 40. Memory controller 40 comprises an interface 44 for communicating with memory device 24, a processor 48, and an Error Correcting Code (ECC) unit 50. The disclosed techniques can be carried out by memory controller 40, by R/W unit 36, or both. Thus, in the present context, memory controller 40 and R/W unit 36 are referred to collectively as storage circuitry that carries out the disclosed techniques.

Memory controller 40 communicates with a host 52, for accepting data for storage in the memory device and for outputting data retrieved from the memory device. ECC unit 50 encodes the data for storage using a suitable ECC and decodes the ECC of data retrieved from the memory. Any suitable type of ECC, such as, for example, Low Density Parity Check (LDPC), Reed-Solomon (RS) or Bose-Chaudhuri-Hocquenghem (BCH), can be used. By using the ECC, a programming operation may be considered successful when the number of memory cells failing to reach their target level is within the error correction capabilities of the ECC.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a RAID storage system. Elements that are not necessary for understanding the principles of the present disclosure, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Early Prediction of a Programming Failure

Figure 2:
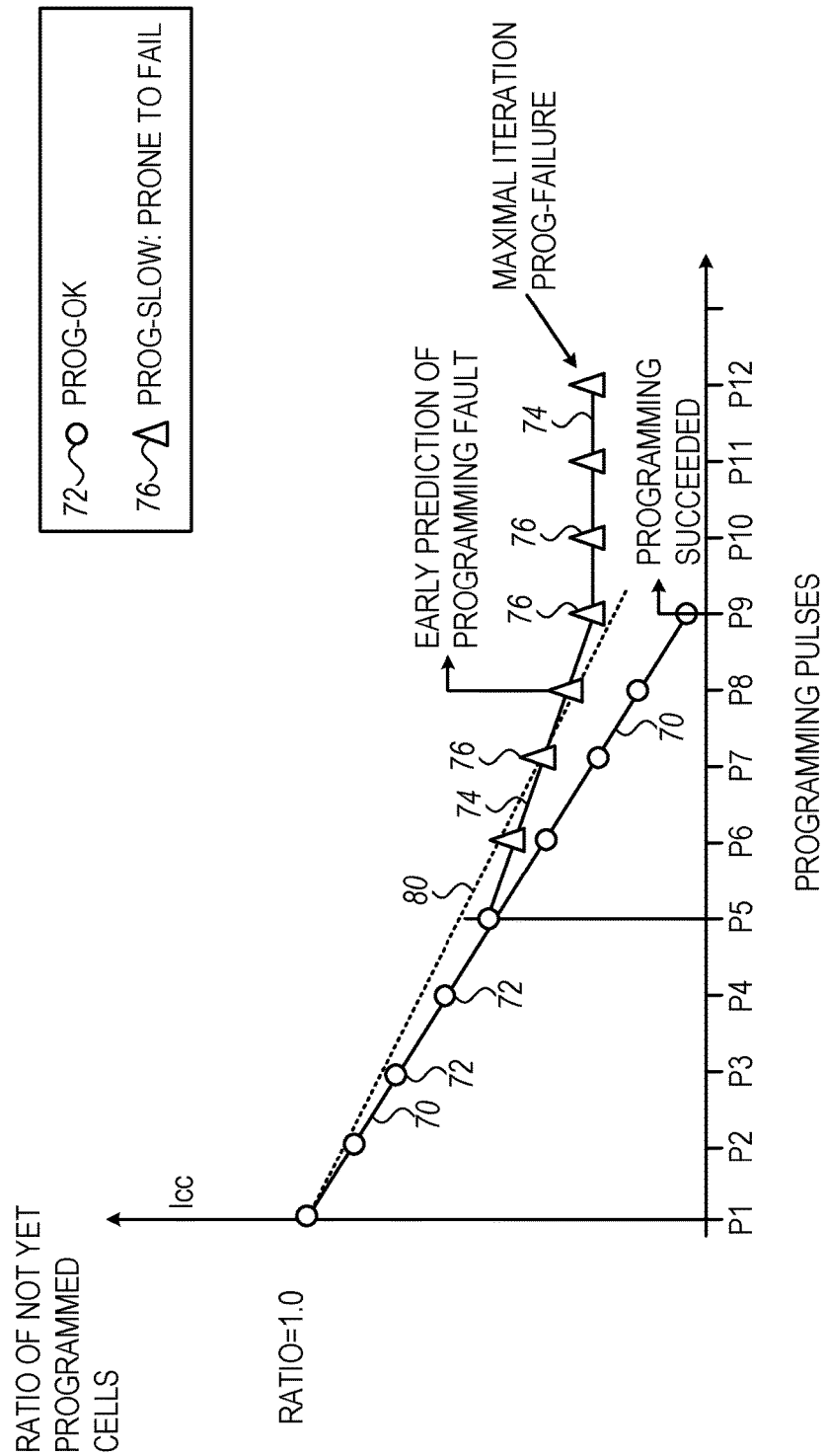
FIG. 2 is a diagram that schematically illustrates behavior of the electrical current consumed and the number of memory cells that remain to be programmed, over multiple programming iterations, in accordance with an embodiment that is described herein.

FIG. 2 is a diagram that schematically illustrates behavior of the electrical current consumed and the number of memory cells that remain to be programmed, over multiple programming iterations, in accordance with an embodiment that is described herein.

In the present example, R/W unit 36 programs data to a group of memory cells such as a word line using iterative programming. The horizontal axis in the diagram depicts a sequence of up to twelve programming pulses denoted P1 . . . P12 that the R/W unit applied in respective twelve iterations. After applying a programming pulse, the R/W unit verifies whether all the cells in the group have reached their target levels. In some embodiments, the R/W unit stops the iterative programming when the verification phase passes or when the entire twelve iterations have been processed.

The vertical axis corresponds to two different measurable parameters that are expected to behave in a certain manner during the iterations: 1) the ratio between the number of memory cells remaining to be programmed relative to the total number of memory cells in the group, also referred to herein as a "cell-count parameter," 2) the electrical current consumed by the memory device during the iteration, also referred to herein as a "current consumption parameter." In the context of the present disclosure and in the claims, the electrical current consumed during a given iteration refers to measuring the current using any suitable method, such as, for example, measuring the average or peak current during the iteration or programming pulse.

In the context of the present disclosure and in the claims, the manner in which a parameter changes over multiple samples of the parameter is also referred to as a "trend" of the parameter. As will be described in detail below, the trend of the cell-count parameter or the current consumption parameter can be used for predicting programming failures.

FIG. 2, depict lines 70 and 74, defined by dots 72, and triangles 76, respectively. Line 72 corresponds to iterative programming that starts with programming pulse P1 and ends successfully at pulse P9. As noted, prior to applying the first programming pulse the ratio equals 1.0 because the memory cells of the entire group are not yet programmed. As the iterations progress, the number of memory cells that already reached their target levels increases and the number of memory cells that still remain to be programmed decreases accordingly.

In the present example, after applying pulse P9, the number of memory cells not reaching their target drops below the error correction capabilities of ECC 50, and therefore the programming operation ends successfully. Since the R/W unit inhibits programming to the memory cells already attaining their target levels, the electrical current consumed typically decreases between successive programming pulses.

Line 76 corresponds to a failing programming operation. As seen in the figure, between programming pulses P5 and P9 line 76 decreases at a lower rate than line 72, which means that a smaller number of cells reach their target levels during the respective iterations. This may occur, for example, when a large number of the memory cells in the group are slow to program. Between pulses P9 and P12, line 76 becomes horizontal, which means that during these iterations no additional cells reach their target levels. This may occur, for example, when the remaining memory cells are defected, or when the word line is shorted to another word line or to the substrate on which the memory cells are deposited.

Note that according to the programming scheme described above, the R/W unit detects a programming failure only after processing all twelve iterations, which reduces the programming throughput, increases the power consumption, and increases program disturb effects.

In the disclosed techniques, the R/W unit analyzes the trend of a certain parameter such as the cell-count parameter and/or the current consumption parameter over multiple iterations or programming pulses. This enables the R/W unit to predict a programming fault at an early point, i.e., before the $12^{th}$ pulse, and take a corrective action. Thus, the R/W unit predicts that the programming operation is expected to fail, long before the maximal iteration, and without actually performing any subsequent programming pulses. In the example of FIG. 2, the R/W unit detects a programming fault at the $9^{th}$ programming pulse and therefore skips the last three iterations P10-P12.

The R/W unit may predict a programming fault in various ways. For example, in FIG. 2, dotted line 80 specifies an upper limit for the cell-count parameter or the current parameter. In an example embodiment, the R/W unit detects a programming fault when the used parameter exceeds this limit for a predefined number of successive iterations. Other criteria for detecting a programming fault are discussed in detail below.

The trends of the cell-count parameter and the current consumption parameter in FIG. 2 are given by way of example, and trends with other suitable characteristics are also possible. For example, different rates of decrease and a maximal number of iterations other than twelve can also be used, e.g., depending on the technology of the memory cells.

Figure 3:
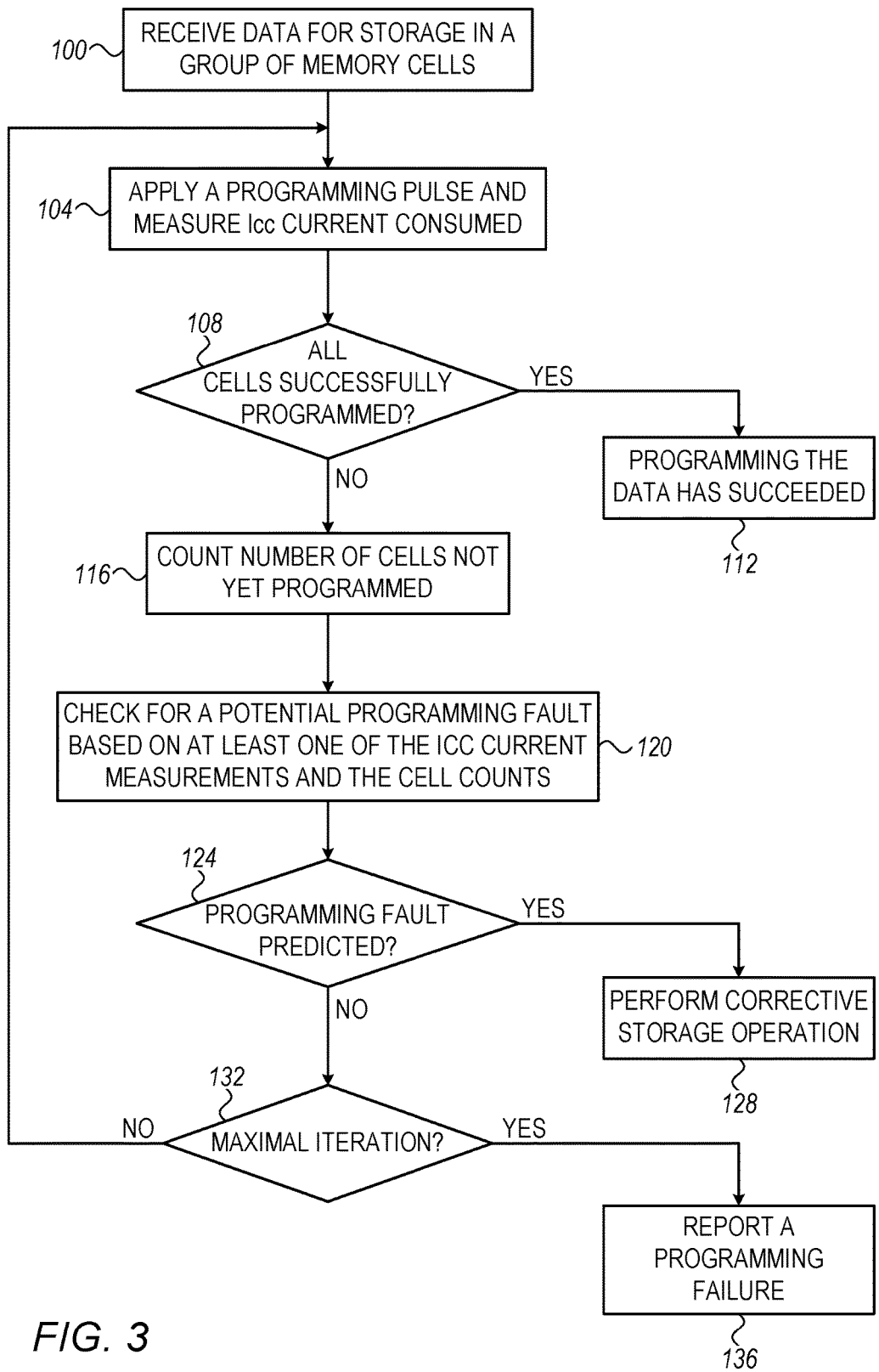
FIG. 3 is a flow chart that schematically illustrates a method for iterative programming that includes early prediction of a programming failure, in accordance with an embodiment that is described herein.

FIG. 3 is a flow chart that schematically illustrates a method for iterative programming that includes early prediction of a programming failure, in accordance with an embodiment that is described herein. The method is described as being executed in combination of both R/W unit 36 of memory device 24, and memory controller 40 of FIG. 1. In the description that follows we assume that the number of iterations or programming pulses applied is limited to some maximal number.

The method begins, at an input step 100, with the R/W unit receiving data from memory controller 40 for storage in a group of memory cells. For example, in a 2 bit/cell MLC device, the received data may comprise a least significant bit (LSB) page or a most significant bit (MSB) page to be programmed to a given word line. Typically, prior to programming, the R/W unit or another element of the memory device stores the data received in a buffer (not shown in FIG. 1) of the memory device.

At a programming step 104, the R/W unit applies a programming pulse (or multiple such pulses) to the memory cells in the group. The amplitude of the programming pulse typically depends on various parameters such as the target levels being programmed, the number of cells not yet reaching their target levels and the programming iteration number. The programming pulse at step 104 may be applied to a partial subset of the memory cells in the group. For example, in programming an LSB page, the R/W unit typically inhibits the programming of memory cells that should remain erased, and memory cells that have already reached the upper programming level.

Further at step 104, the R/W unit measures the electrical current that the memory device consumes during the iteration. In some embodiments, the R/W unit uses multiple measurements of the current consumed over multiple respective iterations for estimating the trend of the current consumption parameter.

At a verification step 108, the R/W unit checks whether all the memory cells in the group have reached their target levels. If the result at step 108 is positive, the R/W unit indicates to the memory controller that the programming operation has succeeded, at a success indication step 112. Otherwise, the R/W unit counts the number of cells in the group that remain to be programmed, at a cell counting step 116. Alternatively, the R/W unit may count the number of memory cells that are inhibited from further programming. In some embodiments the R/W unit uses multiple cell counts over multiple respective iterations for estimating the trend of the cell-count parameter. Each of the current-consumption parameter and the cell-count parameter is indicative of a number of memory cells in the group that have not yet reached their target levels.

At an analysis step 120, the R/W unit analyses the behavior or trend of the current consumption parameter and/or the cell-count parameter to predict whether the data will be written successfully or not within the maximal number of programming pulses. For example, in some embodiments, the R/W unit calculates differences between values of the used parameter and predicts that writing the data will fail based on these differences. For example, if a predefined number of the differences (or their average) in successive iterations are below a predefined difference threshold, the parameter decreases at a slower rate than expected, which predicts that writing the data will fail.

In some embodiments, the R/W unit holds a reference parameter of the expected trend of the used parameter over multiple programming iterations. The reference parameter may be determined, for example, at production time of the memory device, or learned during device operation. Additionally, the R/W unit may adjust the reference parameter during the lifetime of the device to reflect changes that may occur over cycling such as cell programming speed increase, widening of the cell threshold voltage distribution, and the like.

In some embodiments, the R/W unit predicts that writing the data will fail when the trend of the parameter deviates from the trend of the reference parameter by more than a predefined threshold deviation. For example, the R/W unit may measure the deviation by evaluating the difference (or ratio) between the rate of decrease in the measured parameter and the reference parameter. Alternatively or additionally, the R/W unit may measure the deviation by calculating some distance metric between samples of the measured parameter and the reference parameter, e.g., a Euclidian distance, and predict that writing the data will fail when the distance metric exceeds a given distance threshold. In some embodiments, the distance metric is calculated only over samples of the measured parameter that exceed respective samples of the reference pattern.

At a prediction checking step 124, the R/W unit checks whether a programming failure has been predicted at step 120, and if so proceeds to a corrective operation step 128. Otherwise, the R/W unit checks whether the maximal iteration has been processed, at an iteration management step 132. If at step 132 the maximal iteration was not yet processed, the method loops back to step 104 to process a subsequent programming iteration. Otherwise, the maximal iteration has been processed but the programming has failed, and the method proceeds to a failure reporting step 136, in which the R/W unit informs the memory controller of the programming failure.

At step 128, the memory controller may act in various ways. For example, in some embodiments, the memory controller marks the failing word line or the entire memory block as unusable. In an embodiment, the memory controller recovers the data that has failed to be programmed by reading the memory cells of the word line and the data buffered in the buffer of the memory device, and writes the recovered data to another memory block.

Early Prediction of a Programming Failure Based on Elapsed Programming Time

The execution time of a write operation, sometimes denoted Tprog, typically varies over the write operations due to various reasons. In some embodiments, the memory device employs a programming scheme in which Tprog depends on the bit significance of the data page being programmed. For example, Tprog is typically longer in writing MSB pages than LSB pages.

In some embodiments, the R/W unit measures the time that has elapsed since a given time point that represents the starting time of the write operation. In some of the embodiments described below, when the elapsed time is longer than a given timeout limit, the R/W unit predicts that the write operation will fail. The timeout limit may be determined based on statistical properties of Tprog.

Figure 4:
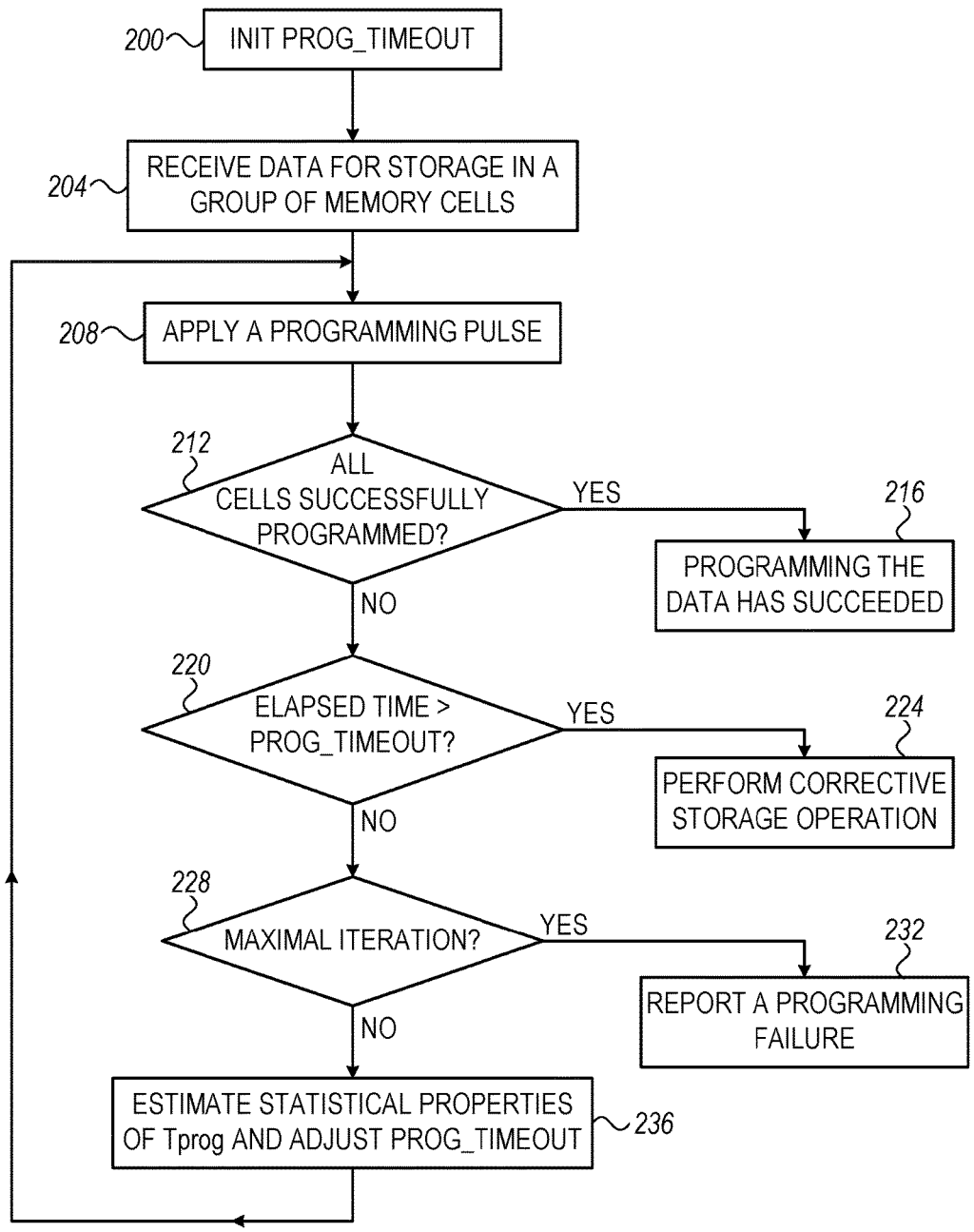
FIG. 4 is a flow chart that schematically illustrates a method for early prediction of a programming failure based on the elapsed time while executing the programming operation, in accordance with an embodiment that is described herein.

FIG. 4 is a flow chart that schematically illustrates a method for early prediction of a programming failure based on the elapsed time while executing the programming operation, in accordance with an embodiment that is described herein. Some of the steps of the method in FIG. 4 are similar to corresponding steps described in the method of FIG. 3 above, and are therefore described herein in brief.

The method begins with R/W unit 36 initializing a time limit, denoted PROG_TIMEOUT, for executing the write operation, at an initialization step 200. In some embodiments, the R/W unit initializes PROG_TIMEOUT based on statistical properties of the write operation execution time— Tprog. For example, the R/W unit sets PROG_TIMEOUT relative to the mean or maximal expected value of Tprog, e.g., PROG_TIMEOUT=0.8·max(Tprog). The statistical properties of Tprog may be initially determined at production, or learned during operation of the memory device.

At an input step 204, the R/W unit receives data for storage in a group of memory cells, similarly to step 100 above, and at a programming step 208, the R/W unit applies a programming pulse to the memory cells in the group. At a verification step 212, if all the memory cells in the group have reached their target levels, the R/W unit informs the memory controller that the programming operation has been successful, at a success indication step 216. Steps 212 and 216 are similar to respective steps 108 and 112 above.

At an elapsed time measurement step 220, the R/W unit measures the elapsed time since a time point representing the starting time of the write operation, and if the elapsed time is longer than PROG_TIMEOUT, the R/W unit proceeds to a corrective operation step 224, which is similar to step 128 above.

If at step 220 the elapsed time is shorter than PROG_TIMEOUT, the R/W unit checks whether the maximal iteration has been processed, at an iteration management step 228, and if so, the method proceeds to a failure reporting step 232 to inform the memory controller that the programming operation has failed. Otherwise, the R/W unit proceeds to an adaptation step 236, in which the R/W unit estimates the statistical properties of Tprog, and adjusts PROG_TIMEOUT accordingly.

Estimating the statistical properties of Tprog may comprise estimating a distribution or histogram of Tprog over multiple write operations. Alternatively or additionally, the statistical properties may comprise at least one of the minimal value, maximal value and mean value of Tprog over multiple write operations. Following step 236 the method loops back to step 208 to process a subsequent programming iteration.

In an embodiment, at step 236, the R/W unit adjusts PROG_TIMEOUT so as to achieve a desired tradeoff between missing the early prediction of programming operation that will indeed fail, and falsely predicting that the write operation will fail even though the programming operation would succeed within the maximal number of iterations.

Multi-Plane Programming with Early Prediction of a Programming Failure

As described above, in some types of memory devices the memory cells are arranged in multiple planes. Such memory devices typically support, in addition to single-plane programming, multi-plane programming in which multiple groups of cells (e.g., word lines) in the respective planes are programmed in parallel. In naive programming methods, the programming iterations continue until the programming succeeds in all the planes or up to the maximal number of iterations. Such a programming scheme causes over programming and program disturb in planes in which the memory cells are faster to program. In the disclosed embodiments, the R/W unit early predicts that the write operation will fail in one or more of the planes and continues to program only the planes in which the programming was not completed, using single-plane programming operations.

Figure 5:
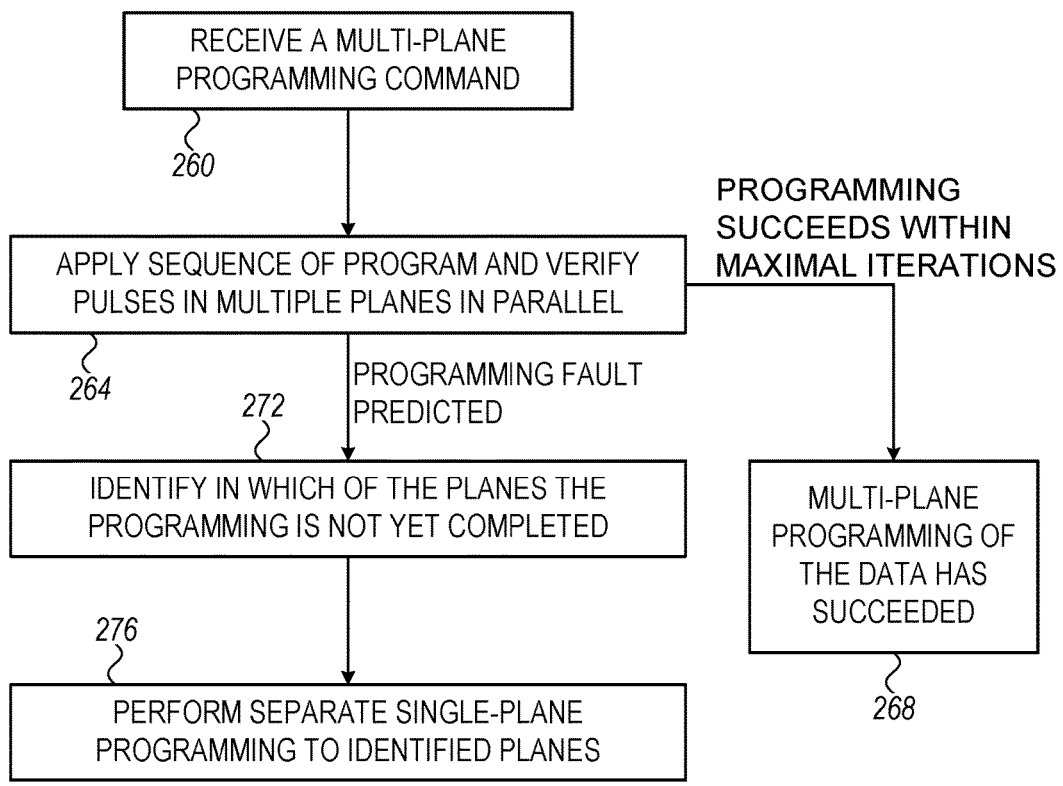
FIG. 5 is a flow chart that schematically illustrates a method for multi-plane programming that includes early prediction of a programming failure, in accordance with an embodiment that is described herein.

FIG. 5 is a flow chart that schematically illustrates a method for multi-plane programming that includes early prediction of a programming failure, in accordance with an embodiment that is described herein. The method begins with R/W unit 36 receiving a multi-plane write command, at a command input step 260. The multi-plane command specifies the data to be programmed and addressing information, such as a block index and word line number in the respective planes.

At a programming step 264, the R/W unit executes iterative multi-plane programming, wherein in each programming iteration the R/W unit applies a programming pulse to the memory cells that are being programmed in the respective planes, in parallel. The iterative programming can be carried out, for example, using methods similar to those described in FIGS. 3 and 4 above.

If at step 264 the programming operation succeeds within a predefined maximal number of iterations the method proceeds to a success reporting step 268, in which the R/W unit reports to the memory controller that the multi-plane programming operation has succeeded.

Otherwise, the R/W unit predicted that the multi-plane write operation will fail, i.e., within the maximal number of iterations the programming will fail in at least one of the planes, and the method proceeds to a plane identification step 272, in which the R/W unit identifies one or more of the planes in which the programming is not yet successfully concluded. For example, in some embodiments, the R/W unit tracks a programming pass/fail status indication in each of the planes separately. In alternative embodiments, the controller sends to the R/W unit a verification command, which the R/W unit applies separately to the planes to identify in which of the planes the multi-programming operation has not yet completed.

At a corrective action step 276, the memory controller applies a single-plane programming operation to each of the planes identified at step 272, e.g., using the methods described in FIG. 3 or 4 above, and the method then terminates. To perform the single-plane commands, the memory controller needs to recover the data to be programmed in the planes identified at step 272. The memory controller can recover this data by reading the respective word lines, and the data that was buffered for programming. In recovering the data, the memory controller may use buffering space that was used for the planes in which the programming is completed.

In some embodiments, predicting that writing the data will fail at step 264 is based on a evaluating the criterion based on measuring multiple parameters corresponding to respective multiple planes. For example, consider a two-plane device for which the expected value of the programming execution times in the first and second planes are denoted Tprog1 and Tprog2, respectively. Assume, for example, that average(Tprog2)=k·average(Tprog1), wherein the average is taken over a sufficiently large number of write operations, and the ratio 0<k is provided by the manufacturer or learned during operation.

In the present example k=1.2, and therefore the programming execution time in the second plane is expected to be longer than in the first plane by about 20%. The R/W unit monitors the programming times in the first and second planes, and if the ratio Tprog1/Tprog2 changes relatively to k by more than a predefined amount, the R/W unit predicts that the write operation will fail. For example, in the present example, if Tprog2 is expected to be 20% longer than Tprog1, but the programming in the second plane ends successfully before the programming in the first plane, this may predict a programming failure in the first plane.

The embodiments described above are given by way of example, and other suitable embodiments can also be used. For example, although in the disclosed embodiments, we mainly assume that processing a programming iteration includes applying one programming pulse and one verification operation, this is not mandatory and other suitable programming schemes can also be used. For example, the verification operation may be carried out once per several programming pulses.

The embodiments described above refer mainly to early prediction of a failure in programming operations. Similar embodiments, however, can be applicable to erasure operations as well.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A storage device, comprising:
multiple memory cells; and
storage circuitry, which is configured to:
write data to a group of the memory cells by applying to the group of the memory cells up to a maximal number of programming pulses;
after applying less than the maximal number of programming pulses, evaluating a criterion that predicts whether or not the data will be written successfully within the maximal number of programming pulses; and
when the criterion predicts that writing the data will fail, perform a corrective operation.

2. The storage device according to claim 1, wherein the storage circuitry is configured to:
evaluate the criterion by estimating a trend of a parameter measured over multiple programming pulses, wherein the parameter is indicative of a number of the memory cells in the group that have not yet reached their target levels.

3. The storage device according to claim 2, wherein the parameter comprises measurements of an electrical current consumed during respective programming pulses.

4. The storage device according to claim 2, wherein the parameter comprises numbers of memory cells that are inhibited from further programming after applying respective programming pulses.

5. The storage device according to claim 2, wherein the storage circuitry is configured to:
estimate the trend by calculating differences between values of the parameter corresponding to different respective programming pulses; and
predict that writing the data will fail based on the differences.

6. The storage device according to claim 2, wherein the storage circuitry is configured to:
hold a reference parameter;
calculate a distance metric between the parameter and the reference parameter; and
predict that writing the data will fail when the distance metric exceeds a given distance threshold.

7. The storage device according to claim 1, wherein the storage circuitry is configured to:
evaluate the criterion by measuring an elapsed programming time since a starting time of writing the data; and
predict that writing the data will fail when the elapsed programming time exceeds a given timeout limit.

8. The storage according to claim 7, wherein the storage circuitry is configured to determine the given timeout limit based on statistical properties of programming execution times.

9. The storage device according to claim 1, wherein the group of the memory cells comprises multiple subgroups that belong to different respective planes of the storage device, and wherein the storage circuitry is configured to:
write the data using a multi-plane programming operation that applies the programming pulses to the memory cells in the multiple subgroups in parallel; and
perform the corrective operation by applying a single-plane programming to at least one of the planes.

10. The storage device according to claim 9, wherein the storage circuitry is configured to:
measure first and second parameters for respective first and second planes; and
predict that writing the data will fail in at least one of the first and second planes by evaluating the criterion based on both the first and second parameters.

11. A method for data storage, comprising:
in a storage device that comprises multiple memory cells, writing data to a group of the memory cells by applying to the group of the memory cells up to a maximal number of programming pulses;
after applying less than the maximal number of programming pulses, evaluating a criterion that predicts whether or not the data will be written successfully within the maximal number of programming pulses, and
when the criterion predicts that writing the data will fail, performing a corrective operation.

12. The method according to claim 11, wherein evaluating the criterion comprises estimating a trend of a parameter measured over multiple programming pulses, wherein the parameter is indicative of a number of the memory cells in the group that have not yet reached their target levels.

13. The method according to claim 12, wherein the parameter comprises measurements of an electrical current consumed during respective programming pulses.

14. The method according to claim 12, wherein the parameter comprises numbers of memory cells that are inhibited from further programming after applying respective programming pulses.

15. The method according to claim 12, wherein estimating the trend comprises calculating differences between values of the parameter corresponding to different respective programming pulses, and wherein evaluating the criterion comprises predicting that writing the data will fail based on the differences.

16. The method according to claim 12, wherein estimating the trend comprises holding a reference parameter and calculating a distance metric between the parameter and the reference parameter, and wherein evaluating the criterion comprises predicting that writing the data will fail when the distance metric exceeds a given distance threshold.

17. The method according to claim 11, wherein evaluating the criterion comprises:
measuring an elapsed programming time since a starting time of writing the data; and
predicting that writing the data will fail when the elapsed programming time exceeds a given timeout limit.

18. The method to claim 17, and comprising determining the given timeout limit based on statistical properties of programming execution times.

19. The method according to claim 11, wherein the group of the memory cells comprises multiple subgroups that belong to different respective planes of the storage device, wherein writing the data comprises writing the data using a multi-plane programming operation that applies the programming pulses to the memory cells in the multiple subgroups in parallel, and wherein performing the corrective operation comprises applying a single-plane programming to at least one of the planes.

20. The method according to claim 19, wherein evaluating the criterion comprises:
measuring first and second parameters for respective first and second planes; and
predicting that writing the data will fail in at least one of the first and second planes based on both the first and second parameters.

* * * * *